United States Patent
Lee et al.

(10) Patent No.: US 6,500,702 B2
(45) Date of Patent: Dec. 31, 2002

(54) METHOD FOR MANUFACTURING THIN FILM TRANSISTOR LIQUID CRYSTAL DISPLAY

(75) Inventors: Deuk Su Lee, Kyoungki-do; Jung Mok Jun, Seoul, both of (KR)

(73) Assignee: Hyundai Display Technology Inc., Kyoungki-Do (KR)

( * ) Notice: Subject to any disclaimer, the term of this patent is extended or adjusted under 35 U.S.C. 154(b) by 0 days.

(21) Appl. No.: 09/736,905

(22) Filed: Dec. 13, 2000

(65) Prior Publication Data

US 2001/0005596 A1 Jun. 28, 2001

(30) Foreign Application Priority Data

Dec. 24, 1999 (KR) ............................. 99-61662

(51) Int. Cl.[7] .............................. H01L 21/84
(52) U.S. Cl. ....................................... 438/155
(58) Field of Search ................... 438/149, 151, 438/155, 158; 257/59; 349/42, 43, 46

(56) References Cited

U.S. PATENT DOCUMENTS 6,256,077 B1 * 7/2001 Baek

* cited by examiner

Primary Examiner—Keith Christianson

(57) ABSTRACT

The present invention discloses a method for manufacturing thin film transistor liquid crystal display including the following steps so as to form simultaneously a via hole for contacting a drain electrode and a pixel electrode mutually and the channel of thin film transistor:

forming sequentially gate insulation layer, amorphous silicon layer for channel and doped semiconductor layer for ohmic contact, and metal layer for source/drain electrode on the back substrate where the gate electrode and the storage capacitor electrode have been formed; patterning the metal layer for source/drain electrode and the doped semiconductor layer for ohmic contact through a second photolithograph process so that the source electrode, the drain electrode, and the ohmic contacts thereof may be formed; forming a passivation layer on the back substrate where the source electrode and the drain electrode have been formed; patterning the passivation layer, the amorphous silicon layer for channel, and the gate insulation layer through a third photolithograph process so that a part of the drain electrode and the back substrate portion between the storage capacitor electrode and the thin film transistor may be exposed.

2 Claims, 5 Drawing Sheets

METHOD FOR MANUFACTURING THIN FILM TRANSISTOR LIQUID CRYSTAL DISPLAY

BACKGROUND OF THE INVENTION

1. Field of the Invention

The present invention is related to method for manufacturing liquid crystal display, and particularly to liquid crystal display using thin film transistor as switching element.

2. Description of the Prior Art

Generally, thin film transistor liquid crystal display has a plurality of unit pixels and thin film transistors corresponding to each of the unit pixels, and thus the high quality, scale-up, and color display of screen and high-speed response can be achieved. Therefore, it is generally used for portable TV, Personal Computer, and navigation appliance of car, and so on.

Thin film transistor is arranged at an intersection region and used as a switching element for selectively controlling on/off operation of pixel electrode.

The conventional method for manufacturing thin film transistor liquid crystal display will be described referring to FIG. 1a through FIG. 1e.

Firstly, as shown in FIG. 1a, metal layer for gate electrode of prescribed thickness is evaporated on a back substrate 1. And, gate electrode 2a and storage capacitor electrode 2b are formed by patterning the metal layer for gate electrode through a first photolithograph process.

Then, as shown in FIG. 1b, gate insulation layer 3, amorphous silicon layer for channel 4, and doped semiconductor layer for ohmic contact 5 are formed sequentially on the back substrate 1 where the gate electrode 2a and the storage capacitor electrode 2b have been formed. And, the doped semiconductor layer for ohmic contact 5 and amorphous silicon layer for channel 4 are so patterned through a second photolithograph process that a thin film transistor area is defined.

Then, as shown in FIG. 1c, metal layer for source/drain electrode is formed on the back substrate 1 where the thin film transistor area has been defined. And, metal layer for source/drain electrode is so patterned through a third photolithograph process that source electrode 6a and drain electrode 6b are formed on both sides of amorphous silicon layer for channel 4. When the metal layer for source/drain electrode is patterned, the doped semiconductor layer for ohmic contact 5 is so patterned that as the same pattern as source electrode 6a and drain electrode 6b are formed.

Then, as shown in FIG. 1d, a passivation layer 7 of SiNx layer on the back substrate 1 where the source electrode 6a and the drain electrode 6b have been formed. And, the passivation layer 7 is so patterned through a fourth photolithograph process that a prescribed part of drain electrode 6b through is exposed. As a result, via hole h is formed at the exposed portion of drain electrode 6b.

And then, as shown in FIG. 1e, so as to contact with drain electrode 6b through via hole h, Indium Tin Oxide(ITO) layer is evaporated over the passivation layer 7. And, the ITO layer is so patterned through a fifth photolithograph process that pixel electrode 8 is formed.

However, each photolithograph process includes lots of detailed steps including register coating step, exposure step, development step, etching step, and register removal step and a different photo mask is required at every photolithograph process. Therefore, it is necessary to reduce the number of photolithograph process in order to decrease manufacturing cost and in order to increase yield.

SUMMARY OF THE INVENTION

Accordingly, an object of the present invention is to provide a method for manufacturing thin film transistor liquid crystal display which can achieve a reduction in a number of photolithograph process.

1. In order to achieve the above described object, the present method for manufacturing thin film transistor liquid crystal display which have a pixel electrode and a counter electrode which are so formed on a back substrate that a driving electric field is generated in a liquid crystal cell, thin film transistor which has gate electrode, source electrode, and drain electrode and which apply prescribed picture signal between the pixel electrode and the counter electrode, and a storage capacitor electrode connected to the counter electrode, includes the following steps. Firstly, forms a metal layer for gate electrode on the back substrate. Thereafter, patterns the metal layer for gate electrode through a first photolithograph process so that the gate electrode and the storage capacitor electrode may be formed. Thereafter, forms sequentially gate insulation layer, amorphous silicon layer for channel and doped semiconductor layer for ohmic contact, and metal layer for source/drain electrode on the back substrate where the gate electrode and the storage capacitor electrode have been formed. Thereafter, patterns the metal layer for source/drain electrode and the doped semiconductor layer for ohmic contact through a second photolithograph process so that the source electrode, the drain electrode, and the ohmic contacts thereof may be formed. Thereafter, forms a passivation layer on the back substrate where the source electrode and the drain electrode have been formed. Thereafter, patterns the passivation layer, the amorphous silicon layer for channel, and the gate insulation layer through a third photolithograph process so that a part of the drain electrode and the back substrate portion between the storage capacitor electrode and the thin film transistor may be exposed. Thereafter, forms a transparent conductive layer for pixel electrode so as to contact with the exposed portions of the drain electrode and the back substrate. Thereafter, patterns the transparent conductive layer for pixel electrode through a fourth photolithograph process so that a pixel electrode may be formed to contact with the exposed portion of drain electrode.

These and other features, aspects, and advantages of the present invention will become better understood with regard to the following description, appended claims, and accompanying drawings.

DETAILED DESCRIPTION OF THE INVENTION

Now, the present invention will be described with reference to the accompanying drawings in detail, in accordance with preferred embodiments.

Figure 1A:
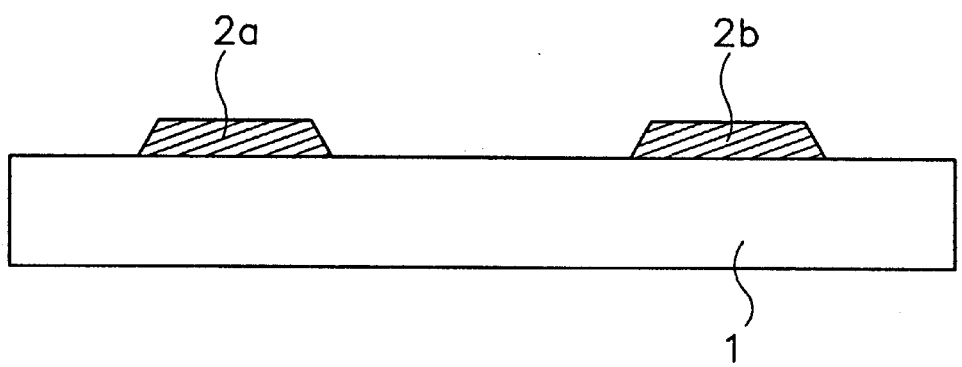
FIG. 1a through FIG. 1e are cross-sectional views to explain each process of the conventional method for manufacturing thin film transistor liquid crystal display.
Figure 1B:
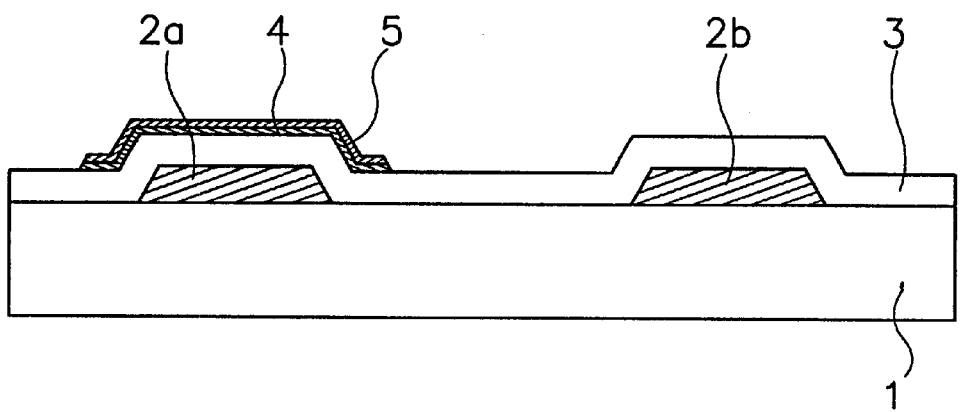
Figure 1C:
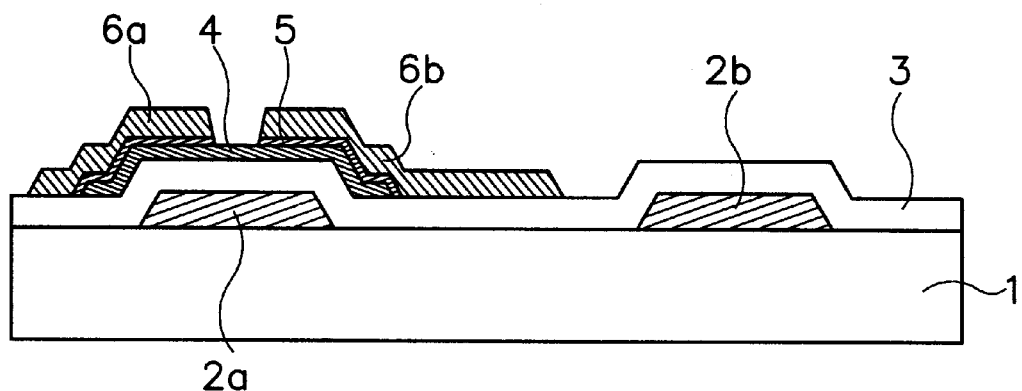
Figure 1D:
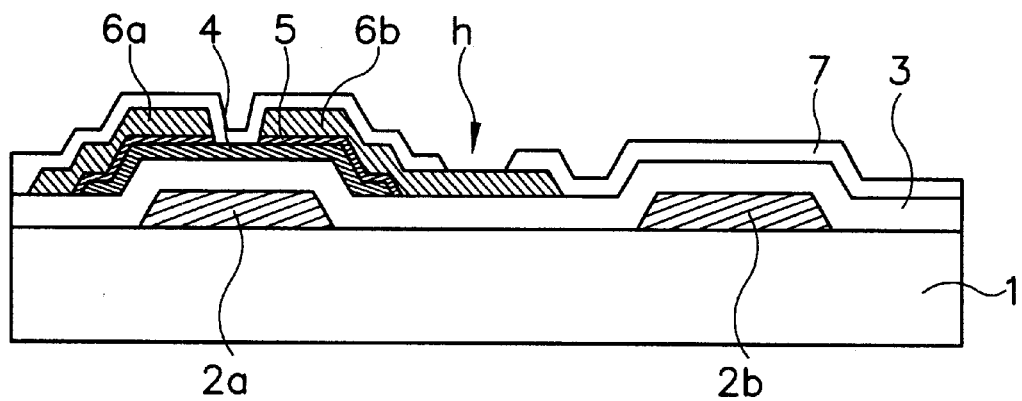
Figure 1E:
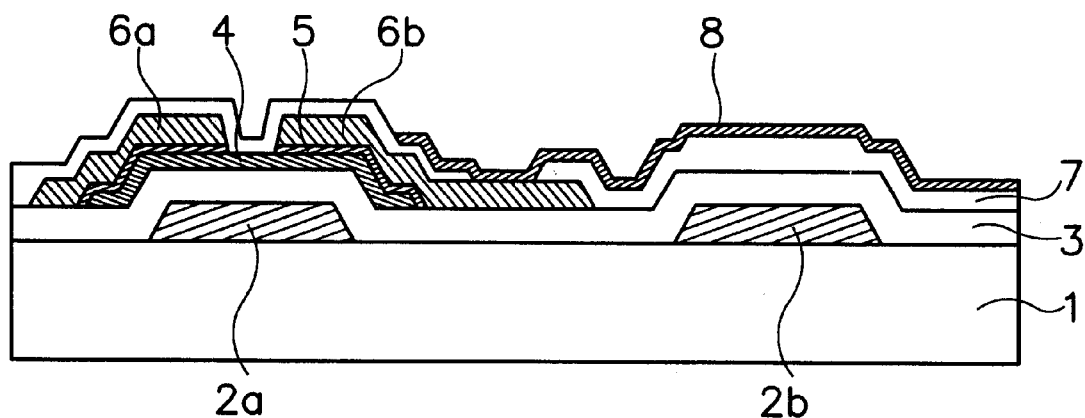
Figure 2A:
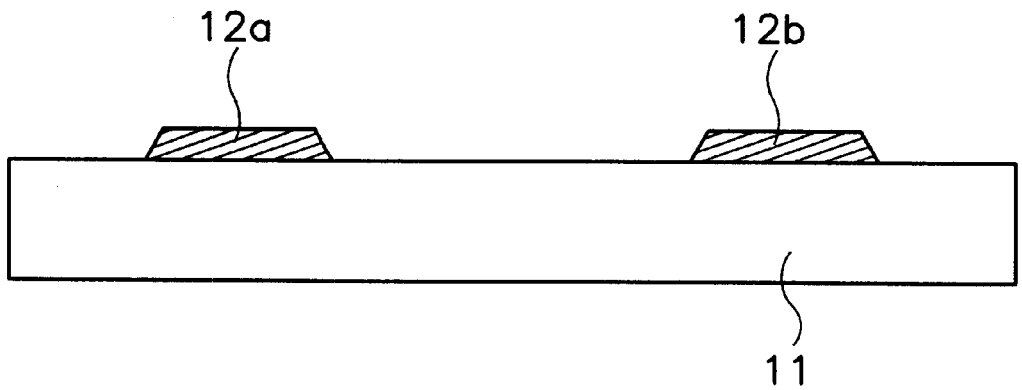
FIG. 2a through FIG. 2d are cross-sectional views to explain each process of the present method for manufacturing thin film transistor liquid crystal display.

Firstly, as shown in FIG. 2a, a metal layer for gate electrode of a prescribed thickness is evaporated on a back substrate 11 made of transparent glass material. And, the metal layer for gate electrode is so patterned a first photolithograph process that a gate electrode 12a and storage capacitor electrode 12b are formed. Here, the first photolithograph process includes the steps of coating photo register film on the metal layer for gate electrode, exposing gate electrode 12a by photo mask in order to form photo register pattern (not shown), developing and etching the metal layer for gate electrode in the same shape as the developed photo register pattern.

Figure 2B:
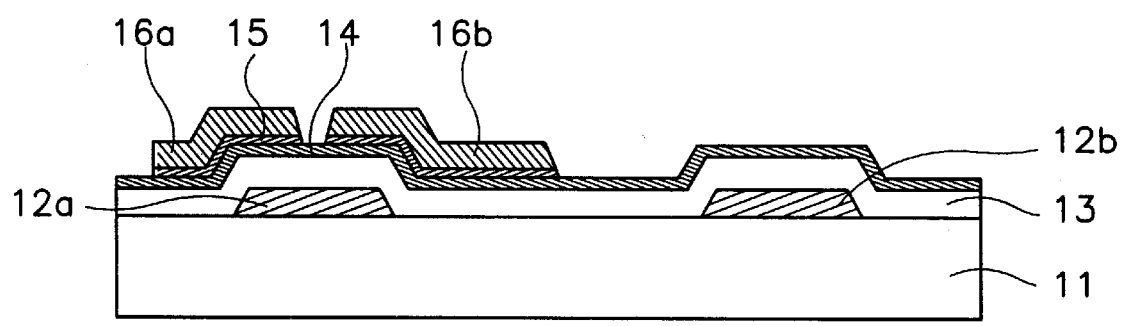

Then, as shown in FIG. 2b, gate insulation layer 13, amorphous silicon layer for channel 14, doped semiconductor layer for ohmic contact 15, and metal layer for source/drain electrode are formed sequentially on the back substrate 11 where the gate electrode 12a and the storage capacitor electrode 12b have been formed. Here, the gate insulation layer 13 may have a single layer structure consisting of SiNx layer for good insulation or dual layer structure consisting of silicon oxide layer and SiNx layer. The amorphous silicon layer 14 is employed for channel of thin film transistor in order to reduce an off current. Thereafter, the metal layer for source/drain electrode is so patterned through a second photolithograph process that a source electrode 16a and drain electrode 16b is formed to be separated by the gate electrode 12a. Thereafter, the doped semiconductor layer is so patterned that a source electrode ohmic contact of the same pattern as the source electrode 16a and a drain electrode ohmic contact of the same pattern as drain electrode 16b are formed. The source electrode 16a and the drain electrode 16b are used as a barrier layer when source electrode ohmic contact and drain electrode ohmic contact are formed.

Figure 2C:
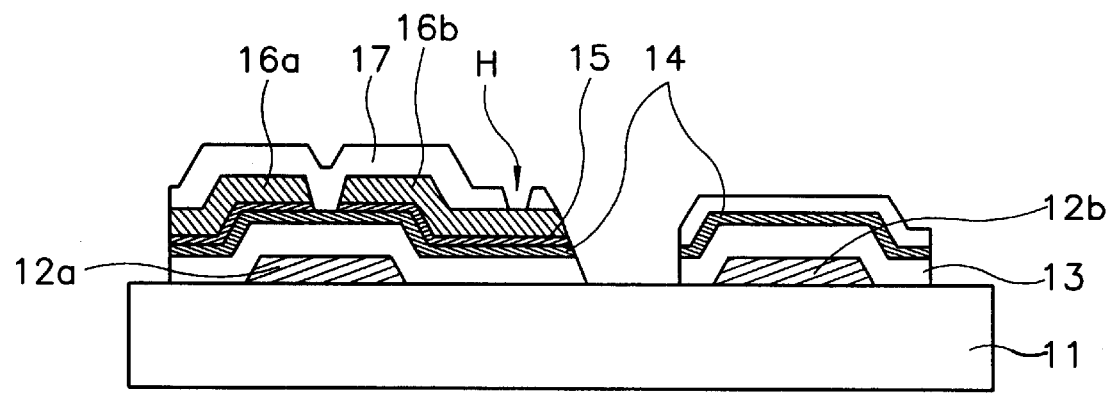

Then, as shown in FIG. 2c, a passivation layer 17 of SiNx layer is formed on the back substrate 11 where the source electrode 16a and the drain electrode 16b have been formed. And, the passivation layer 17, the amorphous silicon layer for channel 14, and the gate insulation layer 13 are so patterned through a third photolithograph process that a part of the drain electrode 16b and the back substrate portion between the storage capacitor 12b and the thin film transistor are exposed. At this time, via hole H is formed at the exposed portion of drain electrode 16b, and the channel of thin film transistor is formed under the source electrode 16a and the drain electrode 16b. And, the storage capacitor electrode 12b and thin film transistor are separated each other.

Figure 2D:
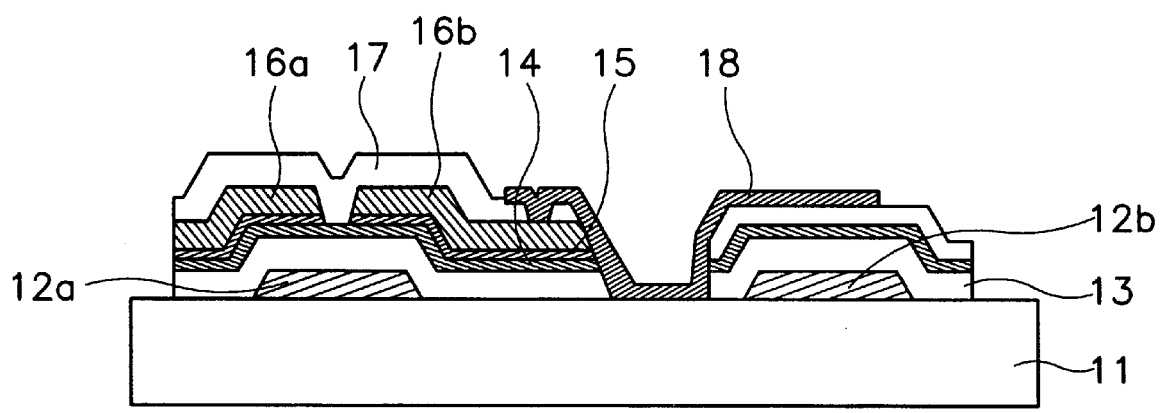

Then, as shown in FIG. 2d, an ITO layer is formed on the passivation layer 7 so as to contact with the drain electrode 16b through via hole H and with the exposed portion of back substrate 11. Thereafter, the ITO layer is so patterned through a fourth photolithograph process that a pixel electrode 8 is formed so as to overlap with the storage capacitor electrode 12b.

The above mentioned second through fourth photolithograph processes are implemented in the same way as the first photolithograph process.

The present invention may be embodied in a variety of forms without departing from the spirit or essential characteristics thereof.

As described above, the present invention has many advantages including the following by forming via hole H for mutually contacting the drain electrode 16b and the pixel electrode 18 and the channel of thin film transistor simultaneously.

The number of photolithograph process is reduced, and thus time and cost for manufacturing are decreased and yield is increased.

What is claimed is:

1. A method for manufacturing a thin film transistor liquid crystal display including a pixel electrode and a counter electrode formed on a substrate so that a driving electric field is generated in a liquid crystal cell, the thin film transistor having a gate electrode, a source electrode, and a drain electrode, and which apply a prescribed picture signal between the pixel electrode and the counter electrode, and a storage capacitor electrode connected to the counter electrode, includes the steps of:

forming a metal layer for a gate electrode on a substrate;

patterning the metal layer for the gate electrode by a first photolithograph process so that the gate electrode and the storage capacitor electrode are formed;

forming sequentially a gate insulation layer, an amorphous silicon layer for a channel and a doped semiconductor layer for providing ohmic contact, and a metal layer for providing a source/drain electrode on the adjacent gate electrode and the storage capacitor electrode formed thereon;

patterning the metal layer for the source/drain electrode and the doped semiconductor layer for ohmic contact by a second photolithograph process so as to form the source electrode, the drain electrode, and the ohmic contacts;

forming a passivation layer on the substrate and on the resulting structure;

patterning the passivation layer, the amorphous silicon layer for providing a channel, and the gate insulation layer through a third photolithograph process so that a part of the drain electrode and the substrate portion between the storage capacitor electrode and the gate electrode become exposed;

forming a transparent conductive layer for the pixel electrode so as to provide contact with the exposed portions of the drain electrode and into contact with the substrate at the exposed position between the gate electrode and the storage capacitor electrode substrate;

patterning the transparent conductive layer for the pixel electrode through a fourth photolithograph process so that a pixel electrode comes into contact with the exposed portion of the drain electrode.

2. The method according to claim 1, wherein the transparent conductive layer for pixel electrode comprises an ITO (indium tin oxide) Layer.

\* \* \* \* \*